(12) United States Patent
Chao et al.

(10) Patent No.: US 11,290,058 B2
(45) Date of Patent: Mar. 29, 2022

(54) SYSTEM AND METHOD FOR REDUCING CURRENT NOISE IN A VCO AND BUFFER

(71) Applicant: QUALCOMM INCORPORATED, San Diego, CA (US)

(72) Inventors: Yue Chao, San Diego, CA (US); Yinghan Wang, San Diego, CA (US); Marco Zanuso, Encinitas, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/076,998

(22) Filed: Oct. 22, 2020

(65) Prior Publication Data

US 2021/0044253 A1 Feb. 11, 2021

Related U.S. Application Data

(63) Continuation of application No. 16/132,731, filed on Sep. 17, 2018, now Pat. No. 10,848,100.

(51) Int. Cl.
*H03B 5/12* (2006.01)
*H03L 7/093* (2006.01)
*H03L 7/08* (2006.01)

(52) U.S. Cl.
CPC ......... *H03B 5/1215* (2013.01); *H03B 5/1228* (2013.01); *H03B 5/1243* (2013.01); *H03B 5/1253* (2013.01); *H03B 5/1293* (2013.01); *H03L 7/08* (2013.01); *H03L 7/093* (2013.01); *H03B 2200/009* (2013.01); *H03B 2200/0034* (2013.01)

(58) Field of Classification Search
CPC ............... H03B 5/1215; H03B 5/1253; H03B 2200/0034; H03B 2200/009; H03B 5/1243; H03B 5/1228; H03B 5/1293; H03L 7/08; H03L 7/093
USPC ............ 330/252, 254; 327/360; 331/117 FE, 331/167, 185
See application file for complete search history.

(56) References Cited

U.S. PATENT DOCUMENTS

| 7,019,598 | B2 | 3/2006 | Duncan et al. | |
|---|---|---|---|---|
| 7,298,183 | B2 * | 11/2007 | Mirzaei | H03K 3/012 327/115 |
| 7,629,817 | B2 * | 12/2009 | Nedovic | H03K 17/6871 327/211 |
| 8,593,207 | B2 | 11/2013 | Liu et al. | |

(Continued)

OTHER PUBLICATIONS

Bhat A., et al., "Low 1/f3 Phase Noise Quadrature LC VCOs," IEEE Transactions on Circuits and Systems—I, Regular Papers, 2018, pp. 1-12.

(Continued)

*Primary Examiner* — Arnold M Kinkead
(74) *Attorney, Agent, or Firm* — Qualcomm Incorporated (57) ABSTRACT

A voltage controlled oscillator (VCO) and buffer circuit includes a voltage controlled oscillator (VCO), a buffer circuit configured to receive a signal generated by the VCO, the buffer circuit comprising a first transistor having a parasitic gate-source capacitance (Cgs), and a second transistor coupled across the first transistor, wherein a gate of the first transistor is coupled to a drain and a source of the second transistor, and a gate of the second transistor is coupled to a source of the first transistor.

22 Claims, 9 Drawing Sheets

(56) References Cited

U.S. PATENT DOCUMENTS

| | | |
|---|---|---|
| 9,742,352 B2 | 8/2017 | Lin et al. |
| 10,326,459 B1* | 6/2019 | Lin .......................... H03L 7/18 |
| 10,848,100 B2 | 11/2020 | Chao et al. |
| 2009/0033428 A1 | 2/2009 | Karri |
| 2009/0102520 A1* | 4/2009 | Lee ........................ H03L 7/183 |
| | | 327/115 |
| 2013/0271230 A1 | 10/2013 | Li et al. |
| 2015/0256369 A1* | 9/2015 | Park .................... H03B 5/1228 |
| | | 332/116 |
| 2020/0091866 A1 | 3/2020 | Chao et al. |

OTHER PUBLICATIONS

Wu C-Y., et al., "A 2-V Low-Power CMOS Direct-Conversion Quadrature Modulator with Integrated Quadrature Voltage-Controlled Oscillator and RF Amplifier for GHz RF Transmitter Applications," IEEE Transactions on Circuits and Systems—II, Analog and Digital Signal Processing, vol. 49, No. 2, Feb. 2002, pp. 123-134.

* cited by examiner

SYSTEM AND METHOD FOR REDUCING CURRENT NOISE IN A VCO AND BUFFER

RELATED APPLICATIONS

This application is a continuation of U.S. patent application Ser. No. 16/132,731 entitled "System And Method For Reducing Current Noise In A VCO and Buffer," filed Sep. 17, 2018, the contents of which are hereby incorporated into this document by reference in its entirety.

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. One of the circuits that process a communication signal is a phase locked loop (PLL). A PLL is a device that compares the phase and/or frequency of two different signals and generates an error signal that represents the phase and/or frequency difference between the two compared signals. When the two signals have different phase and/or frequencies, the phase and/or frequency difference between the two signals is constantly varying. The error signal is then used to control the phase and/or frequency of the loop, such that when the phase and/or frequency difference between the two signals is fixed, the two signals are at the same phase and/or frequency. A PLL typically includes a phase and/or frequency comparator or detector, a voltage controlled oscillator (VCO) that can adjust the frequency of the PLL based on a control voltage signal, a filter circuit, a feedback circuit, and may include other circuits, such as a buffer circuit, etc.

The term "5G" refers to an evolving generation of LTE communication technology. One evolving technology is the ability to communicate over higher frequencies than LTE, such as at millimeter-wave (mmw) frequencies. For example, mmw signals are those that operate at extremely high frequencies, such as 20-30 Gigahertz (GHz) and beyond. A PLL designed to operate at mmw frequencies should meet very stringent integrated phase noise (IPN) specifications, which includes a stringent 1/f noise specification for the VCO. The term "1/f noise" may be defined as a signal or process with a frequency spectrum such that the power spectral density (energy or power per frequency interval) is inversely proportional to the frequency of the signal. At such high frequencies, a current-mode logic (CML) buffer is generally used with the VCO. The CML buffer generally uses a current bias to maintain a constant DC current over variations in process, supply voltage, and temperature (PVT).

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including a voltage controlled oscillator (VCO) and buffer circuit including a voltage controlled oscillator (VCO), a buffer circuit configured to receive a signal generated by the VCO, the buffer circuit comprising a first transistor having a parasitic gate-source capacitance (Cgs), and a second transistor coupled across the first transistor, wherein a gate of the first transistor is coupled to a drain and a source of the second transistor, and a gate of the second transistor is coupled to a source of the first transistor.

Another aspect of the disclosure provides a method for reducing noise in a voltage controlled oscillator (VCO) and buffer including generating a signal using a voltage controlled oscillator (VCO), receiving the signal in a buffer circuit, the buffer circuit comprising a first transistor having a parasitic gate-source capacitance (Cgs), and compensating the parasitic gate-source capacitance (Cgs) of the first transistor using a second transistor coupled across the first transistor, the second transistor having a parasitic gate-source capacitance (Cgs) and a parasitic gate-drain capacitance (Cgd), the parasitic gate-source capacitance (Cgs) and the parasitic gate-drain capacitance (Cgd) of the second transistor compensating for a non-linearity of the parasitic gate-source capacitance (Cgs) of the first transistor.

Another aspect of the disclosure provides a device including voltage controlled oscillator (VCO) means for generating a signal, means for buffering an output of the VCO means, the means for buffering comprising a first transistor having a parasitic gate-source capacitance (Cgs), and means for compensating for a non-linearity of the parasitic gate-source capacitance (Cgs) of the first transistor.

Another aspect of the disclosure provides a phase locked loop (PLL) circuit including a phase/frequency detector configured to provide an error signal, a charge pump responsive to the error signal, the charge pump configured to provide a control signal, a filter configured to receive the control signal and provide a filtered voltage signal, a voltage controlled oscillator (VCO) configured to receive the filtered voltage signal, the VCO having a buffer circuit, the buffer circuit including a first transistor having a parasitic gate-source capacitance (Cgs), a second transistor coupled across the first transistor, the second transistor having a parasitic gate-source capacitance (Cgs) and a parasitic gate-drain capacitance (Cgd), the parasitic gate-source capacitance (Cgs) and the parasitic gate-drain capacitance (Cgd) of the second transistor configured to compensate for a non-linearity of the parasitic gate-source capacitance (Cgs) of the first transistor, and a feedback circuit configured to divide an output of the VCO by a factor, N, and provide the divided VCO output to the phase/frequency detector.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a VCO and buffer circuit having low 1/f noise. In an exemplary embodiment, a non-linear gate-source capacitance of a transistor in a buffer may be compensated by a gate-source capacitance and a gate-drain capacitance of a second transistor coupled across the first transistor.

In an exemplary embodiment, the second capacitor may be coupled across the first transistor, where a gate of the first transistor is coupled to a drain and a source of the second transistor, and a gate of the second transistor is coupled to a source of the first transistor.

Figure 1:
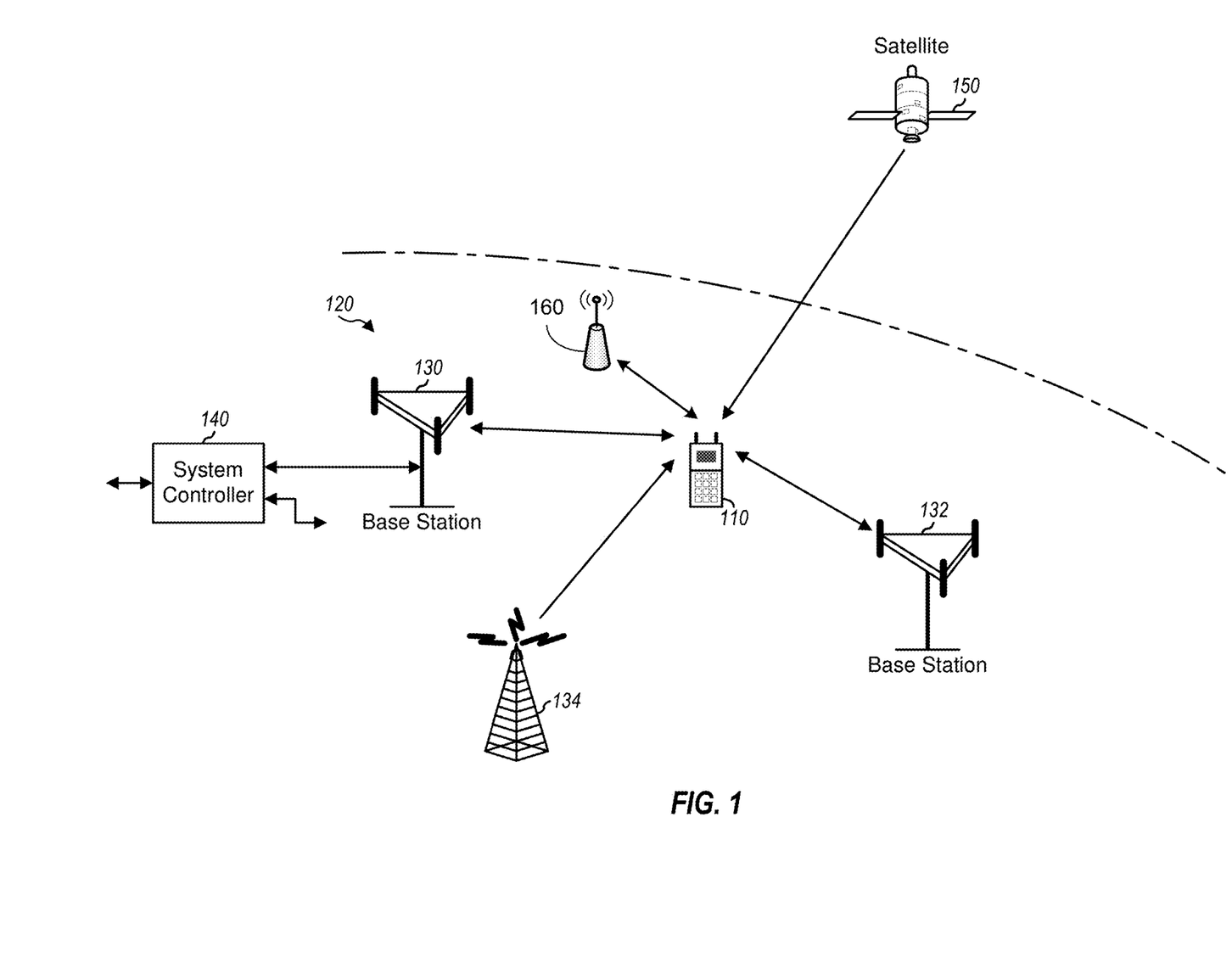
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, which is operation on multiple carriers. Carrier aggregation may also be referred to as multi-carrier operation. In some embodiments, a single stream of data is transmitted using multiple carriers using carrier aggregation, for example as opposed to separate carriers being used for respective data streams.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

The wireless device 110 may also be in communication with a wireless device 160. In an exemplary embodiment, the wireless device 160 may be a wireless access point, or another wireless communication device that comprises, or comprises part of a wireless local area network (WLAN). An exemplary embodiment of a WLAN signal may include WiFi, or other communication signals that use unlicensed communication spectrum in the range of, for example, 5 GHz to 6 GHz.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
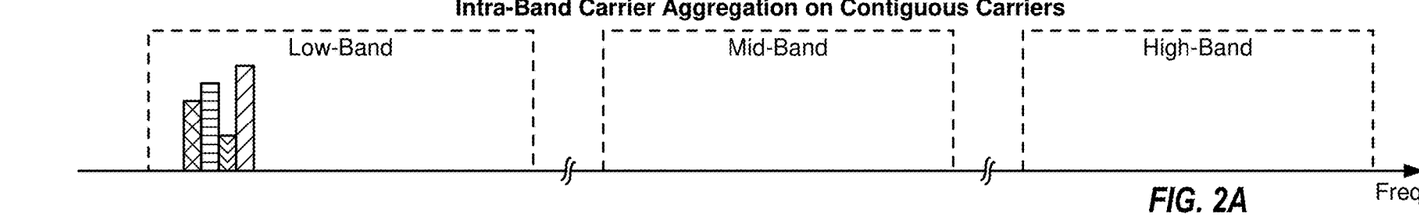
FIG. 2A is a graphical diagram showing an example of contiguous intra-band carrier-aggregation (CA).

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

Figure 2B:
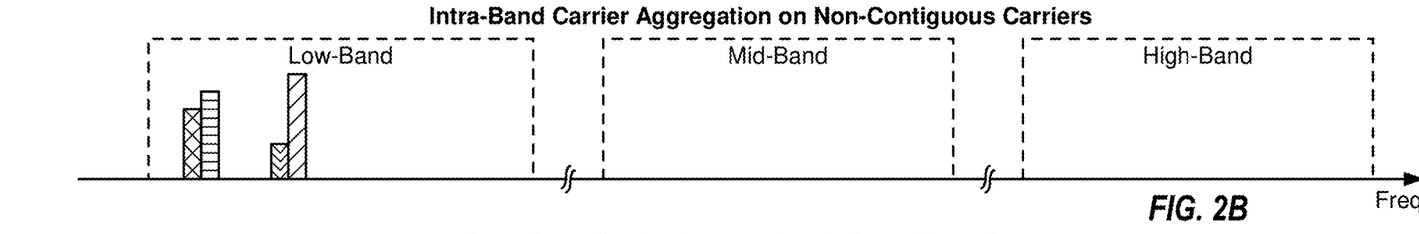
FIG. 2B is a graphical diagram showing an example of non-contiguous intra-band CA.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

Figure 2C:
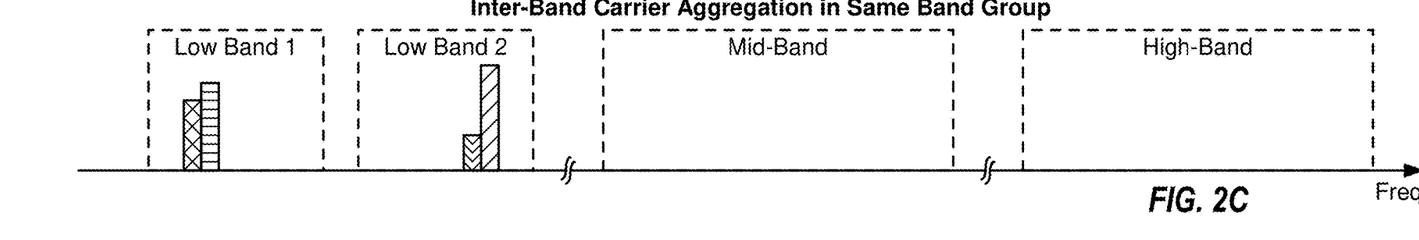
FIG. 2C is a graphical diagram showing an example of inter-band CA in the same band group.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

Figure 2D:
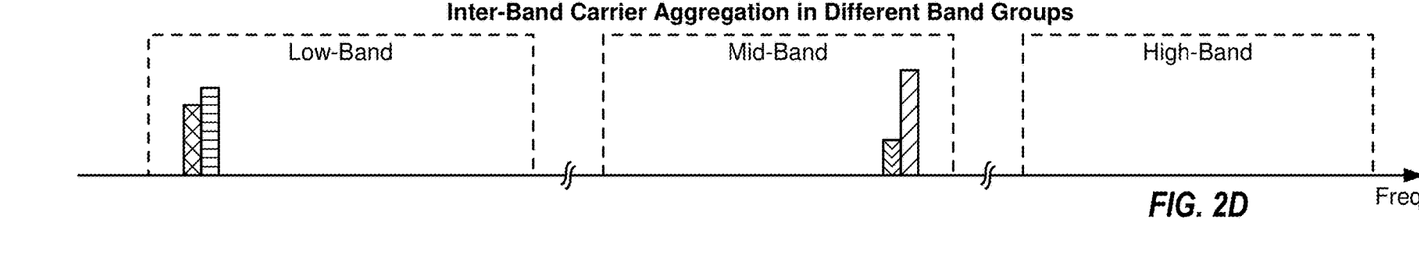
FIG. 2D is a graphical diagram showing an example of inter-band CA in different band groups.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
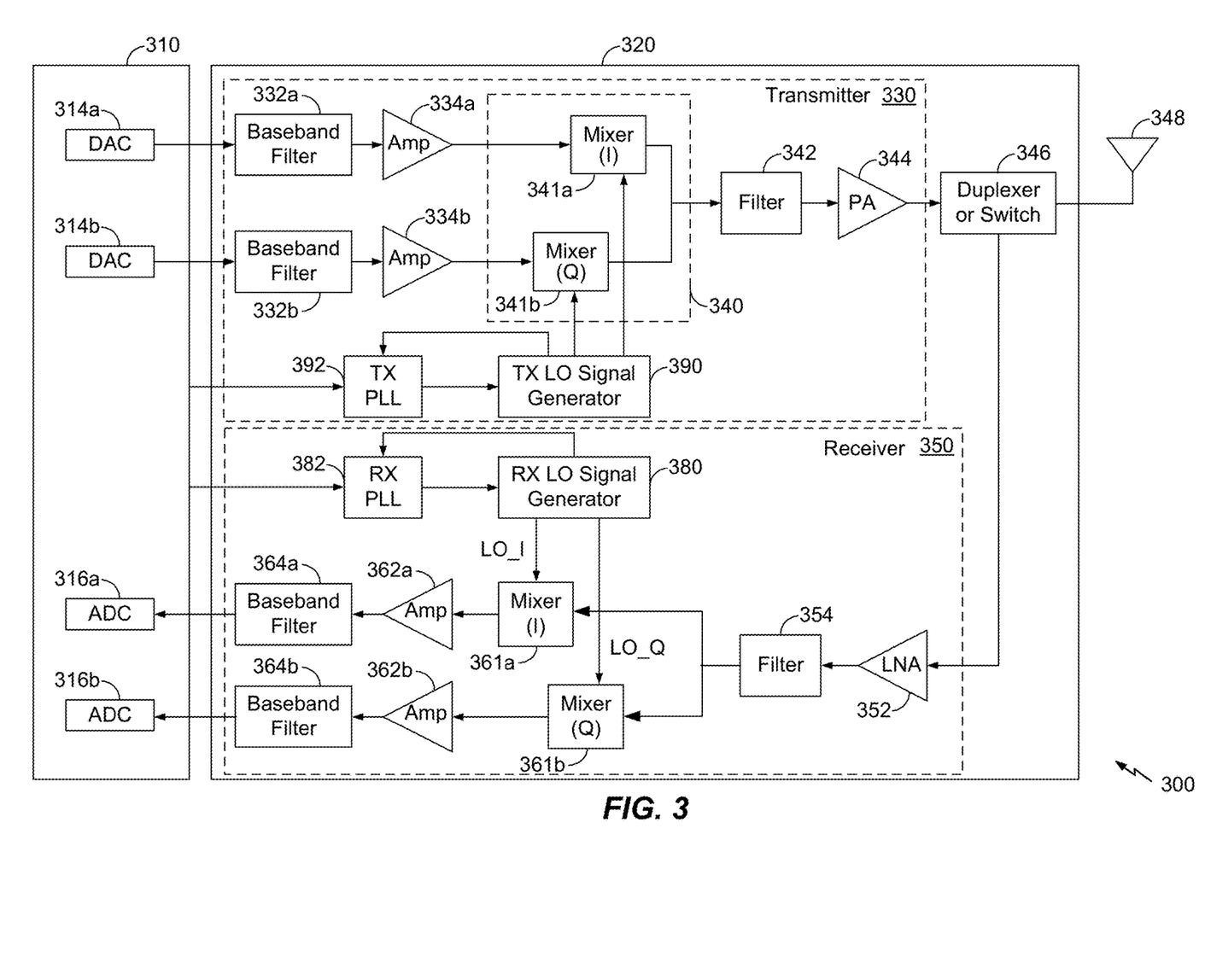
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband, or near baseband, in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing. In other embodiments, the DACs 314a and 314b are included in the transceiver 320 and the data processor 310 provides data (e.g., for I and Q) to the transceiver 320 digitally.

Within the transmitter 330, lowpass filters 332a and 332b filter the I and Q analog transmit signals, respectively, to remove undesired images caused by the prior digital-to-analog conversion Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310. In some embodiments, the ADCs 316a and 316b are included in the transceiver 320 and provide data to the data processor 310 digitally.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 320 are functionally illustrated in FIG. 3, and the configuration illustrated therein may or may not be representative of a physical device configuration in certain implementations. For example, as described above, transceiver 320 may be implemented in various integrated circuits (ICs), RF ICs (RFICs), mixed-signal ICs, etc. In some embodiments, the transceiver 320 is implemented on a substrate or board such as a printed circuit board (PCB) having various modules. For example, the PA 344, the filter 342, and the duplexer 346 may be implemented in separate modules or as discrete components, while the remaining elements illustrated in the transceiver 320 may be implemented in a single transceiver chip.

The power amplifier 344 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 344 can be configured to operate using one or more bias signals and can be configured in various topologies or architectures.

Exemplary embodiments of the disclosure are directed to a VCO and buffer circuit having low 1/f noise. Exemplary embodiments of the VCO and buffer circuit may be part of, or implemented with or within, the RX PLL 382 and/or the TX PLL 392.

Figure 4:
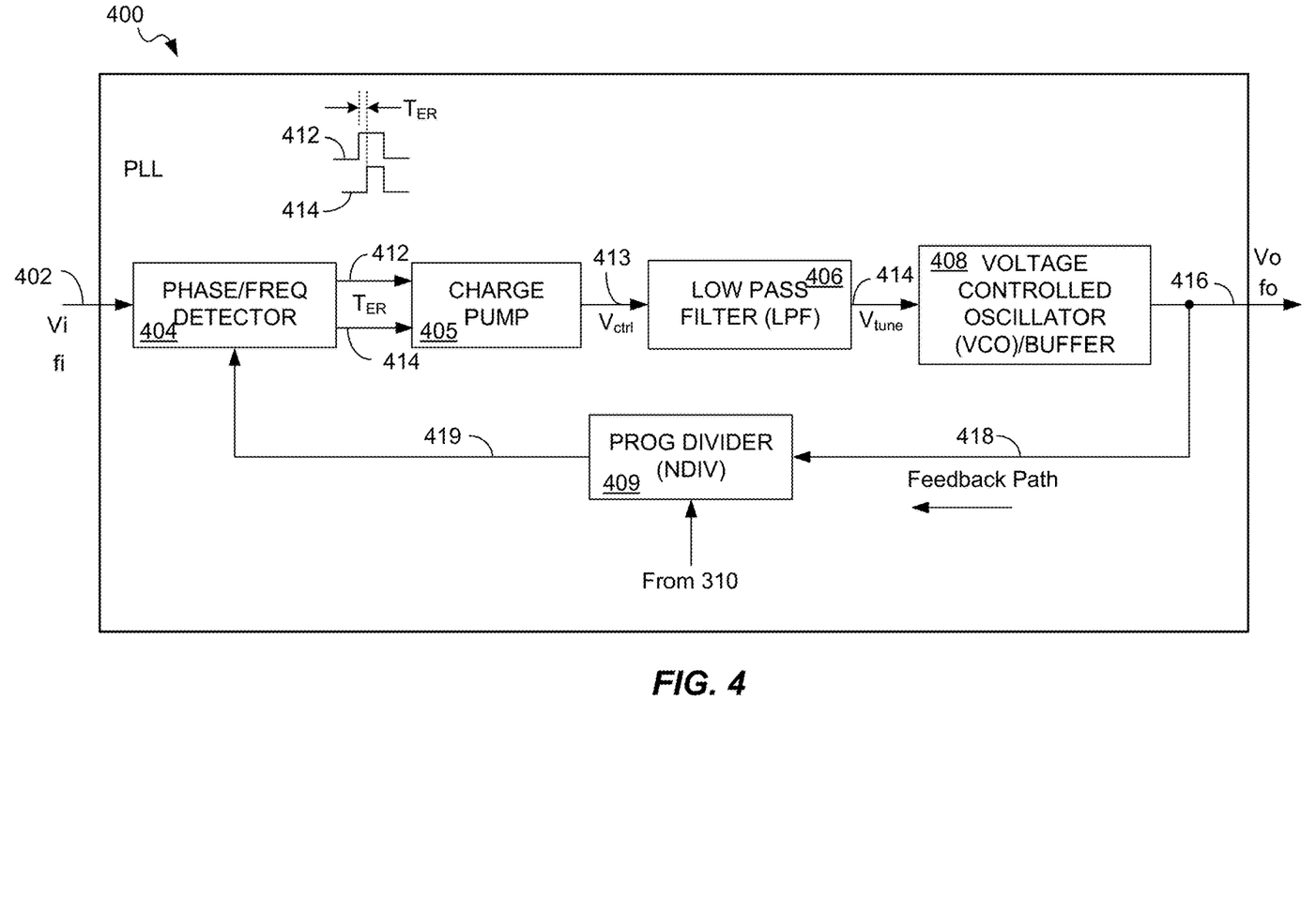
FIG. 4 is a block diagram of a PLL circuit of FIG. 3.

FIG. 4 is a block diagram of a PLL circuit 400. The PLL circuit 400 may be an example of the RX PLL 382 or the TX PLL 392 described herein. In an exemplary embodiment, the PLL circuit 400 includes a phase/frequency detector (PFD) 404, a charge pump 405, a filter 406, a voltage controlled oscillator (VCO)/buffer 408, and a feedback circuit, which may comprise a programmable 1/N divider (NDIV) 409. In an exemplary embodiment, the filter 406 may be a low pass filter (LPF), and may also be referred to as a loop filter.

An input signal Vi with an input phase and frequency fi is provided over connection 402 to the phase/frequency detector 404. In an exemplary embodiment, the phase/frequency detector 404 may comprise a comparator, or other circuitry, which compares the input phase and frequency on connection 402 with a feedback signal based on an output voltage signal, Vo, after processing by the programmable divider 409 on connection 419. The phase/frequency detector 404 provides two signals on connections 412 and 414 where the difference in time between the rising edges of the signals on connections 412 and 414 represents the timing error, $T_{ER}$, representing the phase and frequency difference between the input signals on connections 402 and 419. The timing error, $T_{ER}$, is then provided over connections 412 and 414 to the charge pump 405. In an exemplary embodiment, the phase/frequency detector 404 compares the input phase on connections 402 and 419 and converts the phase difference into a timing error, $T_{ER}$, which can be represented by the amount of time occurring between two rising edges of two signals on connections 412 and 414. The charge pump 405 then converts the timing error, $T_{ER}$, into a control voltage, $V_{ctrl}$. In response to the timing error signal, the charge pump 405, which may operate as a time-to-voltage converter, raises or lowers the DC voltage on connection 413 based on whether the timing error, $T_{ER}$, is increasing or decreasing, and generates the control voltage, $V_{ctrl}$, on connection 413. If the timing error, $T_{ER}$, is zero (0), then the output of the charge pump 405 is constant. The output of the charge pump 405 is provided over connection 413 to the filter 406. In an exemplary embodiment, the phase/frequency detector 404 and the charge pump 405 may be combined in a single functional block. In an exemplary embodiment where the filter 406 is a low pass filter, the filter 406 removes high frequency noise from the output signal of the charge pump 405 on connection 413 and provides a steady DC level VCO tuning voltage $V_{tune}$, on connection 414.

The DC voltage $V_{tune}$ is then provided to the VCO/buffer 408. The frequency (fo) of the output of VCO/buffer 408 is directly proportional to the input signal, Vi. Both the input phase and frequency, fi, and output phase and frequency, fo, are compared and adjusted through the feedback path 418 until the output frequency, fo, equals the input frequency, fi.

The programmable divider 409 may be programmable by, for example, the data processor 310 of FIG. 3, to provide a divide-by-n function (NDIV). The PLL circuit 400 operates in three stages, these being free-running, capture and phase lock.

In an exemplary embodiment, the phase/frequency detector 404 may be a comparator circuit that compares the input phase and frequency, fi, and the output phase and frequency, fo, of the VCO/buffer 408 after being divided by the programmable divider 409 and together with charge pump 405 produces a DC voltage, $V_{ctrl}$ that is proportional to the phase/frequency difference between the input phase and frequency, fi, and the output phase and frequency, fo. The phase/frequency detector 404 and charge pump 405 may be implemented using analog or digital circuitry.

In an exemplary embodiment, filter 406 attenuates high frequency noise in the output of the charge pump 406, thus helping to control the dynamic characteristics of the PLL circuit 400. The dynamic characteristics include capture and lock ranges, bandwidth, and transient response. The lock range is the tracking range where the range of frequencies of the PLL circuit 400 follows the changes in the input phase and frequency. The capture range is the range in which the PLL circuit 400 attains the phase lock. The VCO/buffer 408 generates an output phase and frequency that is directly proportional to the input voltage, $V_{tune}$.

Figure 5:
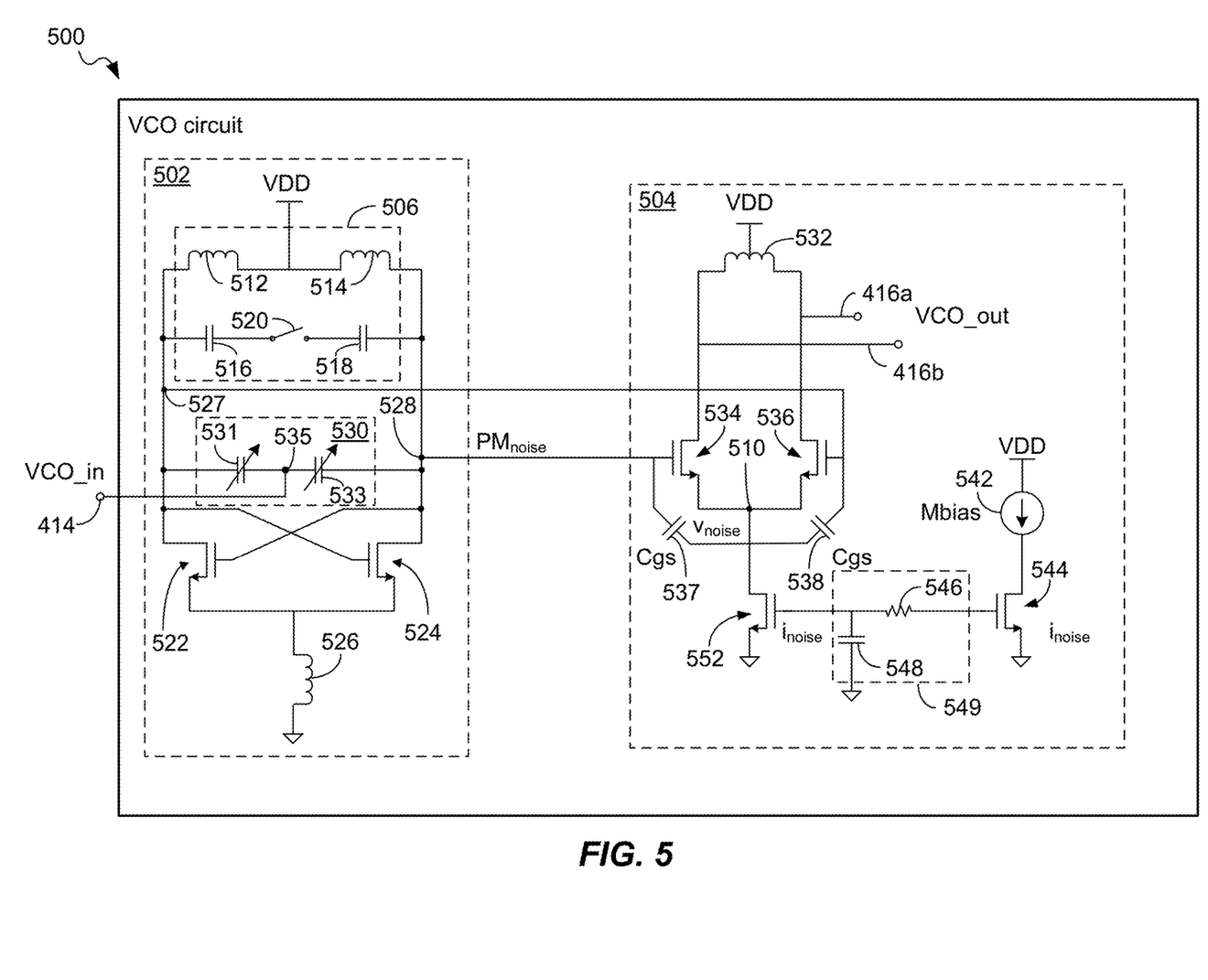
FIG. 5 is a schematic diagram showing a VCO circuit comprising a VCO and a buffer.

FIG. 5 is a schematic diagram showing a VCO circuit 500 comprising a VCO 502 and a buffer 504. The VCO 502 comprises a tank circuit 506 having inductors 512 and 514, capacitors 516 and 518, and a switch 520. The VCO 502 also comprises transistors 522 and 524, and an inductor 526. The inductors 512 and 514 are coupled to a system voltage, VDD. In an exemplary embodiment, the VCO 502 also comprises a varactor circuit 530 having voltage-adjustable capacitances 531 and 533. In an exemplary embodiment, the input to the VCO 502 is provided to the node 535 between the variable capacitances 531 and 533 in the varactor circuit 530.

The buffer 504 comprises an inductor 532 coupled to a system voltage, VDD. The inductor 532 is also coupled to the drain of a transistor 534 and is coupled to the drain of a transistor 536. The source of the transistor 534 and the source of the transistor 536 are each coupled to a node 510. The node 510 is also coupled to the drain of a transistor 552. The output of the VCO circuit 500 is taken from the drain of the transistor 534 and the drain of the transistor 536 at outputs 416a and 416b. In an exemplary embodiment, the output on connections 416a and 416b is differential.

The gate of the transistor 534 is coupled to a node 528, which is also coupled to the drain of the transistor 524. The gate of the transistor 536 is coupled to a node 527, which is also coupled to the drain of the transistor 522. The node 527 is also coupled to the gate of the transistor 524, and the node 528 is also coupled to the gate of the transistor 522. An output signal generated by the VCO 502 is provided to the buffer circuit 504 via the node 527 to the gate of the transistor 536 and via the node 528 to the gate of the transistor 534. In an exemplary embodiment, the output signal generated by the VCO 502 at nodes 527 and 528 is a differential signal.

The transistor 534 has a parasitic gate-source capacitance, Cgs, shown schematically using a capacitor 537, and the transistor 536 has a parasitic gate-source capacitance, Cgs, shown schematically using a capacitor 538.

A bias current source 542 producing a bias current Mbias, is coupled to a system voltage, VDD, and is also coupled to the drain of a transistor 544. The gate of the transistor 544 is coupled to a resistor 546. The resistor 546 is also coupled to a capacitor 548 and to the gate of the transistor 552. The resistor 546 and the capacitor 548 comprise an RC filter 549.

Current noise that is proportional to frequency, referred to as $i_{noise}$, or 1/f current noise, from the current source 542 and the current bias of the transistor 544 and the transistor 552 will appear as 1/f voltage noise, $v_{noise}$, at the source of transistor 534 and the source of transistor 536 at the source node 510. This 1/f voltage noise at the source node 510 will be up-converted to $f_{osc}$ (the oscillation frequency of the VCO 502) and will degrade VCO close-in phase noise, leading to a circuit in which the RC filter 549 should be large to minimize the effect of the up-converted 1/f voltage noise. Making the RC filter 549 large consumes valuable circuit area and power. The up-conversion of the 1/f voltage noise is caused by the parasitic gate-source capacitance Cgs of the transistors 534 and 536. The parasitic gate-source capacitance Cgs of the transistors 534 and 536, which is shown schematically with the capacitors 537 and 538, respectively, is non-linear and is dependent on the gate-source voltage Vgs of the transistors 534 and 536.

The 1/f voltage noise, $v_{noise}$ at the source of transistor 534 and the source of transistor 536, at source node 510 modulates the parasitic gate source capacitance, Cgs, and is upconverted to phase modulation noise, $PM_{noise}$, at the output of the VCO 502 at nodes 527 and 528, which then appears on the output terminals 416a and 416b through the transistors 534 and 536. This upconversion of the 1/f current noise by the oscillation frequency of the VCO 502 worsens when the capacitors 516 and 518 in the tank circuit 506 are switched off by the switch 520, resulting in less linear capacitance in the tank circuit 506, which leads to more 1/f noise up-conversion, and more $PM_{noise}$ appearing at the output of the VCO 502 at nodes 527 and 528 and then at connections 416a and 416b.

Thus, it is desirable to reduce the amount of 1/f voltage noise at the node 510, and thus reduce the amount of noise that is upconverted to $f_{osc}$.

Figure 6:
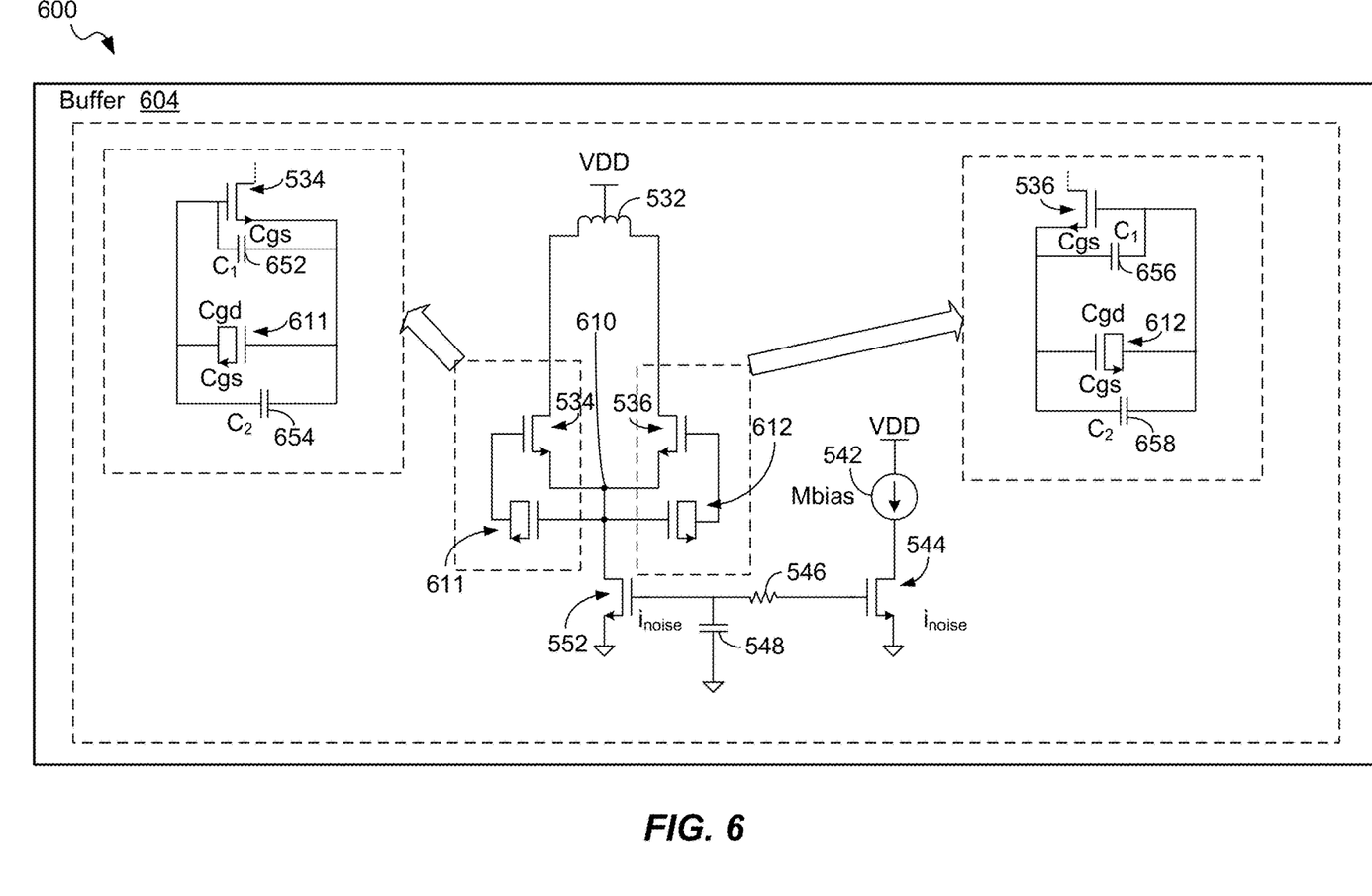
FIG. 6 shows a schematic diagram of a buffer circuit configured to reduce 1/f noise.

FIG. 6 shows a schematic diagram 600 of a buffer circuit 604 configured to reduce 1/f noise. In an exemplary embodiment, a compensation transistor 611 is added between the gate and source of transistor 534, and a compensation transistor 612 is added between the gate and source of transistor 536. In an exemplary embodiment, the compensation transistor 611 and the compensation transistor 612 may be metal oxide semiconductor (MOS) transistors. In an exemplary embodiment, the connection of the compensation transistor 611 is such that the drain and source of the compensation transistor 611 are connected to the gate of the transistor 534. In an exemplary embodiment, the gate of the compensation transistor 611 is connected to the source of the transistor 534 and the source of the transistor 536 at node 610. Similarly, the drain and source of the compensation transistor 612 are connected to the gate of the transistor 536. The gate of the compensation transistor 612 is connected to the source of the transistor 534 and the source of the transistor 536 at node 610, and also to the gate of the compensation transistor 611, which is also coupled to the source of the transistor 534 and the source of the transistor 536 at node 610.

The gate-source capacitance, Cgs, and the gate-drain capacitance, Cgd, of the compensation transistor 611 and the gate-source capacitance, Cgs, and the gate-drain capacitance, Cgd, of the compensation transistor 612 are used to compensate for the non-linear parasitic capacitance Cgs of the transistor 534 and the non-linear parasitic capacitance Cgs of the transistor 536, respectively.

By sizing the transistor 611 and the transistor 612 properly, such as making the transistor 611 smaller than the transistor 534 and by making the transistor 612 smaller than the transistor 536, the non-linearity of the gate-source capacitance, Cgs, of the transistor 534 and the non-linearity of the gate-source capacitance, Cgs, of the transistor 536, shown schematically as capacitors 652 and 656, ($C_1$), respectively, can be substantially cancelled by the gate-source capacitance, Cgs, and the gate-drain capacitance, Cgd, of the transistor 611 and by the gate-source capacitance, Cgs, and the gate-drain capacitance, Cgd, of the transistor 612, shown schematically as capacitors 654 and 658, ($C_2$), respectively. In an exemplary embodiment, the transistor 611 may be substantially one half the size of the transistor 534 and the transistor 612 may be substantially one half the size of the transistor 536.

In an exemplary embodiment, the size of the transistors 534, 536, 611 and 612 refers to the channel size, which is determined by the width (w) and length (l) of the transistor for planar transistors and by the number of fins for fin-FET transistors.

In an exemplary embodiment, the capacitance added by the transistor 611 and the transistor 612 should have good circuit layout matching with the input transistor 534 and the input transistor 536 to compensate for the non-linear capacitance of the input transistor 534 and the input transistor 536. This may include laying out the transistors to equalize the parasitic capacitance and using the same type of transistors and placing them as close as possible for good matching.

The parasitic gate-source capacitance of the transistor 536 is schematically shown as capacitor 656 ($C_1$), and the parasitic gate-source and gate-drain capacitance of the transistor 612 is schematically shown as capacitor 658 ($C_2$). Similarly, the parasitic gate-source capacitance of the transistor 534 is schematically shown as capacitor 652 ($C_1$), and the parasitic gate-source and gate-drain capacitance of the transistor 611 is schematically shown as capacitor 654 ($C_2$). In this manner, the total input capacitance of the buffer 604 (the capacitance of capacitors 652 and 656 ($C_1$)+the capacitance of capacitors 654 and 658 ($C_2$)) form a combined capacitance ($C_1+C_2$) that may be significantly less dependent on the gate-source voltage of the transistors 534 and 536 than the parasitic gate-source capacitance (Cgs) of either the transistor 536 or the transistor 612 alone; or the transistor 534 or the transistor 611 alone.

In this manner, by making the combined capacitance ($C_1+C_2$) less dependent on the gate-source voltage of the transistors 534 and 536, significantly less 1/f voltage noise appears at the source node 610 (and 510 of FIG. 5) and significantly less PM noise appears on the output of the VCO on connections 416a and 416b (FIG. 5).

Figure 7:
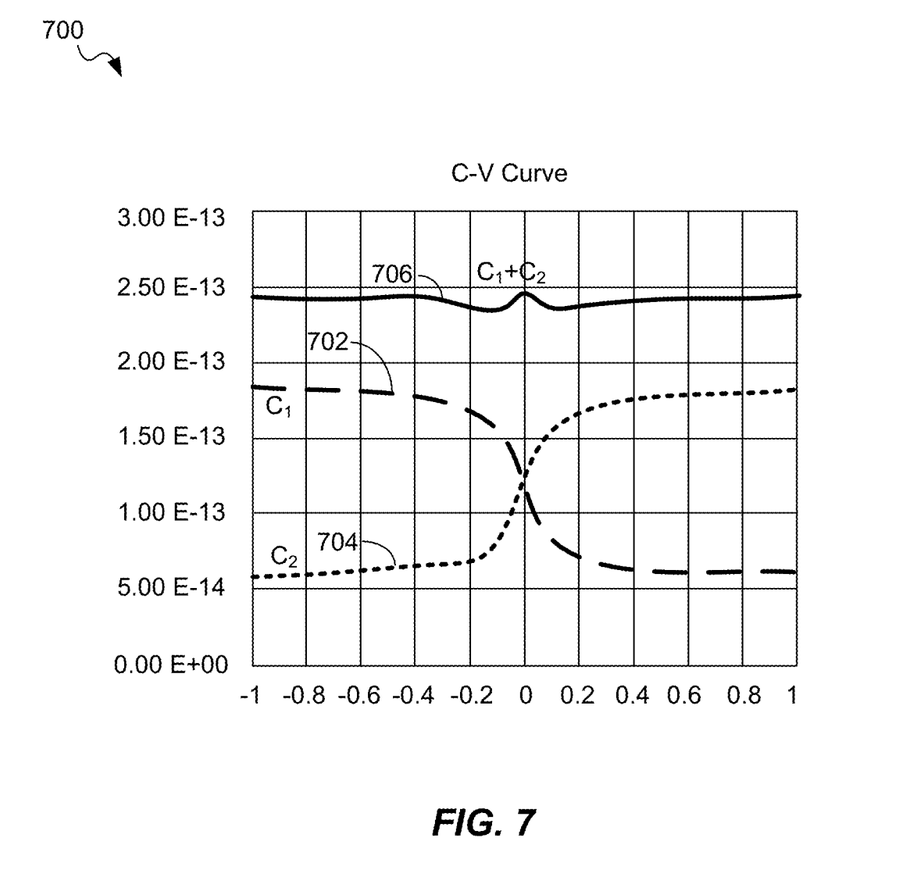
FIG. 7 is a graph showing the capacitance of $C_1$ and $C_2$ of the buffer of FIG. 6 responsive to voltage.

FIG. 7 is a graph showing the capacitance of $C_1$ and $C_2$ of the buffer of FIG. 6 responsive to the gate-source voltage of transistors 534 and 536 (FIG. 6). The vertical axis shows capacitance and the horizontal axis shows voltage. Trace 702 shows the total parasitic capacitance ($C_1$) of transistors 534 and 536, trace 704 shows the total capacitance ($C_2$) of transistors 611 and 612, and the trace 706 shows the combined capacitance ($C_1+C_2$), and shows that the combined capacitance ($C_1+C_2$) is significantly less dependent on the gate-source voltage of transistors 534 and 536 (FIG. 6) than either $C_1$ or $C_2$ alone.

Figure 8:
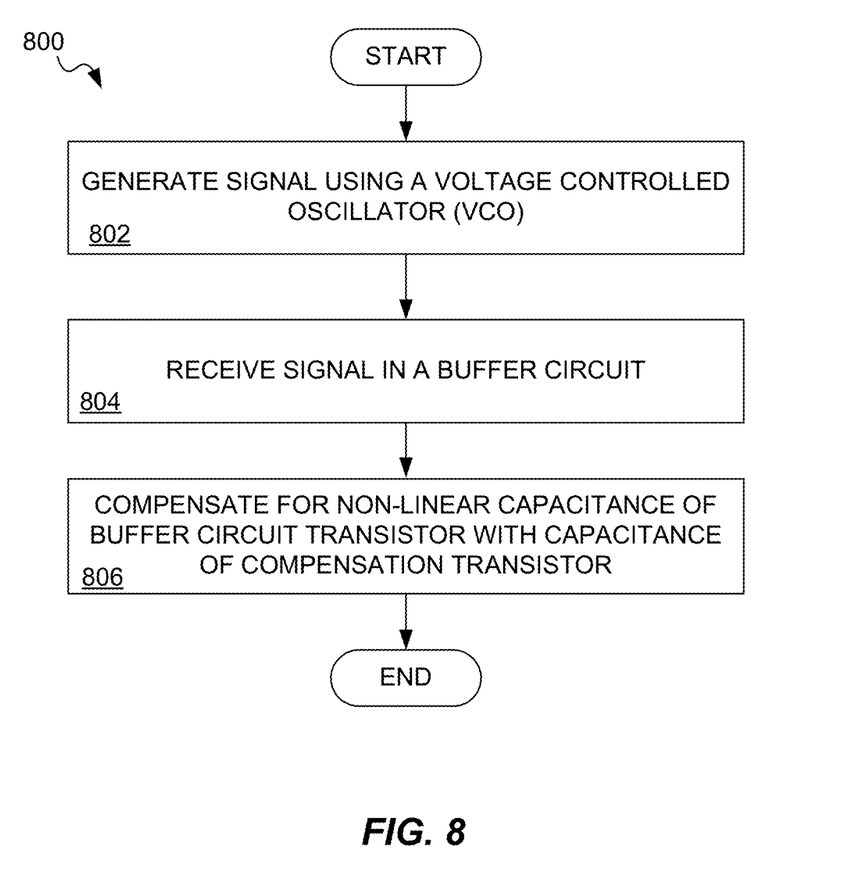
FIG. 8 is a flow chart describing an example of the operation of a VCO and buffer circuit in accordance with an exemplary embodiment of the disclosure.

FIG. 8 is a flow chart 800 describing an example of the operation of a VCO and buffer circuit. The blocks in the method 800 can be performed in or out of the order shown, and in some embodiments, can be performed at least in part in parallel.

In block 802, a signal is generated using a voltage controlled oscillator (VCO), such as the VCO 502 described above with respect to FIG. 5.

In block 804, the signal generated by the VCO 502 (FIG. 5) in block 802 is received in a buffer circuit 504 (FIG. 5 that is coupled to the VCO 502.

In block 806, non-linear capacitance of the buffer circuit 504 (FIG. 5) is compensated using a capacitance of a compensation transistor. For example, the compensation transistor 611 (FIG. 6) may be coupled across a buffer transistor 534 (FIG. 6) such that the gate of the buffer transistor 534 may be coupled to a drain and a source of the compensation transistor 611, and a gate of the compensation transistor 611 is coupled to a source of the buffer transistor 534.

Figure 9:
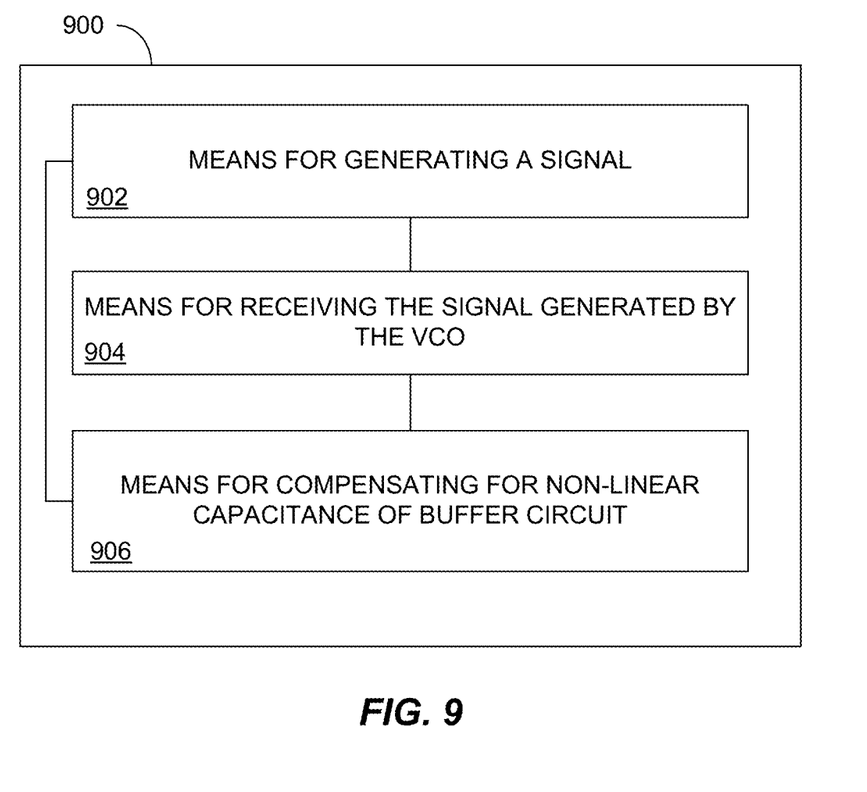
FIG. 9 is a functional block diagram of an apparatus for a VCO and buffer circuit in accordance with an exemplary embodiment of the disclosure.

FIG. 9 is a functional block diagram of an apparatus for a VCO and buffer circuit in accordance with an exemplary embodiment. The apparatus 900 comprises means 902 for generating a signal. In certain embodiments, the means 902 for generating a signal can be configured to perform one or more of the functions described in operation block 802 of method 800 (FIG. 8). In an exemplary embodiment, the means 902 for generating a signal may comprise the VCO 502 of FIG. 5 generating an output that is provided to the buffer circuit 504.

The apparatus 900 also comprises means 904 for receiving the signal generated by the VCO. In certain embodiments, the means 904 for receiving the signal generated by the VCO can be configured to perform one or more of the functions described in operation block 804 of method 800 (FIG. 8). In an exemplary embodiment, the means 904 for receiving the signal generated by the VCO may comprise receiving the signal generated by the VCO 502 of FIG. 5 in the buffer circuit 504.

The apparatus 900 also comprises means 906 for compensating a non-linear capacitance of the buffer circuit. In certain embodiments, the means 906 for compensating a non-linear capacitance of the buffer circuit can be configured to perform one or more of the functions described in operation block 806 of method 800 (FIG. 8). In an exemplary embodiment, the means 906 for compensating a non-linear capacitance of the buffer circuit may comprise the compensation transistor (611/612) of FIG. 6 being coupled across the buffer transistor (534/536) such that the gate of the buffer transistor (534/536) is coupled to a drain and a source of the compensation transistor (611/612), and a gate of the compensation transistor (611/612) is coupled to a source of the buffer transistor (534/536).

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A buffer circuit, comprising:
   a first transistor and a second transistor each comprising a gate, a source coupled to a node, and a drain coupled to a voltage source;
   a third transistor coupled between the gate of the first transistor and the node, the third transistor configured to compensate for a non-linear capacitance of the first transistor;
   a fourth transistor coupled between the gate of the second transistor and the node, the fourth transistor configured to compensate for a non-linear capacitance of the second transistor; and
   a bias circuit coupled to the node, the bias circuit comprising a bias current source, a first bias transistor coupled to the bias current source, and a second bias transistor coupled to the node.

2. The buffer circuit of claim 1, wherein the bias circuit comprises a current bias.

3. The buffer circuit of claim 1, wherein the gates of the first and second transistors are further coupled to a voltage controlled oscillator.

4. The buffer circuit of claim 1, wherein the third transistor comprises a source and a drain coupled to the gate of the first transistor and comprises a gate coupled to the node, and wherein the fourth transistor comprises a source and a drain coupled to the gate of the second transistor and comprises a gate coupled to the node.

5. The buffer circuit of claim 4, wherein the bias circuit further comprises a filter coupled between the first bias transistor and the second bias transistor.

6. The buffer circuit of claim 1, wherein the third transistor has a channel size that is smaller than a channel size of the first transistor, and wherein the fourth transistor has a channel size that is smaller than a channel size of the second transistor.

7. The buffer circuit of claim 6, wherein the channel size of the third transistor is approximately half of the channel size of the first transistor, and wherein the channel size of the fourth transistor is approximately half of the channel size of the second transistor.

8. A buffer circuit, comprising:
a first transistor and a second transistor each comprising a gate, a source coupled to a node, and a drain coupled to a voltage source;
a third transistor coupled between the gate of the first transistor and the node;
a fourth transistor coupled between the gate of the second transistor and the node;
a bias circuit coupled to the node; and
an inductor coupled between the voltage source and the drains of the first and second transistors.

9. The buffer circuit of claim 8, wherein the voltage source supplies a system voltage.

10. The buffer circuit of claim 1, wherein the drain of the first transistor is coupled to a first output and wherein the drain of the second transistor is coupled to a second output.

11. The buffer circuit of claim 10, wherein the buffer circuit is included in a phase locked loop circuit, and wherein the first output and the second output are configured as outputs of the phase locked loop circuit.

12. The buffer circuit of claim 11, wherein the outputs of the phase locked loop circuit are coupled to local oscillator circuitry in a transmitter or receiver.

13. The buffer circuit of claim 12, wherein the local oscillator circuitry is in the transmitter and the transmitter is configured to transmit multiple uplink carriers using carrier aggregation, or wherein the local oscillator circuitry is in the receiver and the receiver is configured to receive multiple downlink carriers using carrier aggregation.

14. A buffer circuit, comprising:
means for receiving a differential signal, the means for receiving being coupled to a node;
means for biasing the means for receiving, the means for biasing being coupled to the node, the means for biasing comprising a bias current source, a first bias transistor coupled to the bias current source, and a second bias transistor coupled to the node; and
means for reducing, at the node, 1/f voltage noise from the means for biasing, the means for reducing being coupled between the means for receiving and the node.

15. The buffer circuit of claim 14, wherein the means for receiving is coupled to a system voltage.

16. The buffer circuit of claim 14, wherein the means for receiving comprises a first means for receiving coupled between a first signal of the differential signal and the node, and comprises a second means for receiving coupled between a second signal of the differential signal and the node, and wherein the means for reducing comprises a first means for reducing coupled between the first signal and the node, and comprises a second means for reducing coupled between the second signal of the differential signal and the node.

17. The buffer circuit of claim 16, wherein the means for reducing comprises means for compensating for a non-linear capacitance of the means for receiving.

18. The buffer circuit of claim 16, wherein the first means for receiving comprises a transistor having a parasitic gate-source capacitance (Cgs), and wherein the first means for reducing comprises a transistor having a parasitic gate-source capacitance (Cgs) and a parasitic gate-drain capacitance (Cgd) configured to compensate for a non-linearity of the parasitic gate-source capacitance (Cgs) of the first means for receiving.

19. The buffer circuit of claim 14, wherein the means for biasing comprises a current bias.

20. The buffer circuit of claim 14, wherein the means for biasing comprises a transistor coupled between the node and a current source.

21. The buffer circuit of claim 20, wherein the means for biasing comprises means for filtering coupled between the transistor and the current source.

22. The buffer circuit of claim 14, wherein the differential signal is received from a voltage controlled oscillator.

\* \* \* \* \*